United States Patent

Ramakrishnan et al.

[11] Patent Number: 5,933,316
[45] Date of Patent: Aug. 3, 1999

[54] METHOD FOR FORMING A TITANATE THIN FILM ON SILICON, AND DEVICE FORMED THEREBY

[75] Inventors: Ed S. Ramakrishnan; Kenneth D. Cornett; Wei-Yean Howng, all of Albuquerque, N. Mex.

[73] Assignee: Motorola Inc., Schaumburg, Ill.

[21] Appl. No.: 08/100,226

[22] Filed: Aug. 2, 1993

[51] Int. Cl.$^6$ .................. H01G 4/10; H01G 4/06
[52] U.S. Cl. .............. 361/311; 361/322; 361/321.4; 257/295
[58] Field of Search .............. 361/321.4, 321.5, 361/322, 305, 313; 365/145, 149; 257/295, 296, 298, 300, 751–753, 770; 438/250–256, 239, 393–399

[56] References Cited

U.S. PATENT DOCUMENTS

| | | | |
|---|---|---|---|
| 3,579,063 | 5/1971 | Wasa | 361/313 |
| 5,122,477 | 6/1992 | Wolters et al. | 437/60 |
| 5,142,437 | 8/1992 | Kammerdiner et al. | 361/313 |
| 5,164,808 | 11/1992 | Evans, Jr. et al. | 361/305 |
| 5,173,835 | 12/1992 | Cornett et al. | 257/310 |
| 5,192,871 | 3/1993 | Ramakrishnan | 257/595 |
| 5,242,534 | 9/1993 | Bullington et al. | 156/634 |
| 5,262,920 | 11/1993 | Sakuma et al. | 361/321.5 |
| 5,293,510 | 3/1994 | Takenaka | 257/295 |
| 5,338,951 | 8/1994 | Argos, Jr. et al. | 257/295 |
| 5,374,578 | 12/1994 | Patel et al. | 437/52 |
| 5,466,629 | 11/1995 | Mihara et al. | 437/60 |
| 5,561,307 | 10/1996 | Mihara et al. | 257/295 |
| 5,620,739 | 4/1997 | Azuma et al. | 427/79 |

FOREIGN PATENT DOCUMENTS

| | | | |
|---|---|---|---|
| 0065111 | 3/1990 | Japan | 361/313 |

*Primary Examiner*—Kristine Kincaid
*Assistant Examiner*—Anthony Dinkins
*Attorney, Agent, or Firm*—Brian M. Mancini; Gary J. Cunningham

[57] ABSTRACT

A method for forming a dielectric layer onto a substrate having a silicon surface includes initially depositing an oxidizable metal thin film onto the surface and thereafter depositing a thin film of a metal titanate compound, such as the zirconium titanate. The metal thin film is preferably formed of tantalum, titanium or zirconium. Following deposition of the metal titanate thin film, the metal titanate is annealed by heating in an oxidizing atmosphere at a temperature effective to recrystalize the titanate to increase the dielectric properties. During annealing, the metal film reacts with oxygen to form a metal oxide thin film intermediate the metal titanate thin film and the silicon surface. The oxidation of the metal thin film inhibits oxidation of the underlying silicon that would otherwise reduce the effective capacitance of the dielectric layer. The resulting coated substrate thus includes a dielectric layer that includes a thin film of the oxidized metal and an oxygen-annealed metal titanate thin film and exhibits an increased effective capacitance and improved dielectric properties, particularly in comparison to a comparable oxygen-annealed titanate films formed directly onto silicon surfaces.

5 Claims, 1 Drawing Sheet

METHOD FOR FORMING A TITANATE THIN FILM ON SILICON, AND DEVICE FORMED THEREBY

BACKGROUND OF THE INVENTION

This invention relates to a method for forming a titanate thin film on a silicon substrate. More particularly, this invention relates to a method that comprises depositing a metal film onto the silicon surface prior to deposition of the titanate film, which metal film is oxidized during annealing of the titanate film to inhibit formation of silicon dioxide and thereby increase the effective capacitance of the titanate film.

In the manufacture of microelectronic devices of the type that are based upon a silicon substrate, it is known to fabricate features that comprise a thin film of a dielectric material overlying the silicon surface. Such dielectric films are found, for example, in dynamic random access memory (DRAM), bypass capacitors and voltage variable capacitors. Silicon dioxide is commonly employed as a dielectric film for this purpose, but suffers from a low dielectric constant, K, that limits its usefulness, particularly in very thin films. It has been proposed to utilize a metal titanate film to take advantage of its relatively high dielectric constant. A preferred metal titanate film is composed of zirconium titanate, $ZrTiO_4$. Zirconium titanate is suitably deposited by sputtering, but requires a high temperature anneal to develop the crystalline structure that displays the high dielectric constant and provides other desired electrical properties. This anneal is carried out in an oxidizing atmosphere to optimize the oxygen content and thereby improve the electrical leakage resistance of the film.

It is found that thin films of zirconium titanate formed immediately onto a silicon surface do not exhibit the high effective capacitance that is expected based upon the high dielectric constant of the bulk material. As used herein, effective capacitance refers to the capacitance per area measured between the substrate and an electrode affixed to the outer face of the dielectric film. The low effective capacitance is particularly observed for thin films having thickness less than about 500 A°. It is now been found that this is due to the formation of silicon dioxide at the interface during oxygen annealing of the zirconium titanate.

SUMMARY OF THE INVENTION

This invention contemplates an improved method for forming a dielectric thin film of an oxygen-annealed metal titanate compound, such as the zirconium titanate, onto a silicon surface. In accordance with this invention, the silicon surface is initially coated with a thin film of a metal that is oxidizable at titanate annealing temperatures, preferably tantalum, titanium or zirconium. A metal titanate compound is deposited onto the metal film, for example, by sputtering, and annealed by heating in an oxidizing atmosphere at a temperature effective to recrystalize the titanate to form a high dielectric film. During annealing, the metal film reacts with oxygen to inhibit oxidation of the underlying silicon and to form a metal oxide thin film. The resulting microelectronic device formed in accordance with this invention thus comprises a thin film of the oxidized metal intermediate an oxygen-annealed metal titanate thin film and the underlying silicon surface and exhibits an increased effective capacitance and improved dielectric properties, particularly in comparison to a comparable titanate films formed directly onto silicon surfaces.

BRIEF DESCRIPTION OF THE DRAWINGS

The present invention will be further illustrated with reference to the accompanying drawings wherein.

DETAILED DESCRIPTION OF A PREFERRED EMBODIMENT

Figure 2:
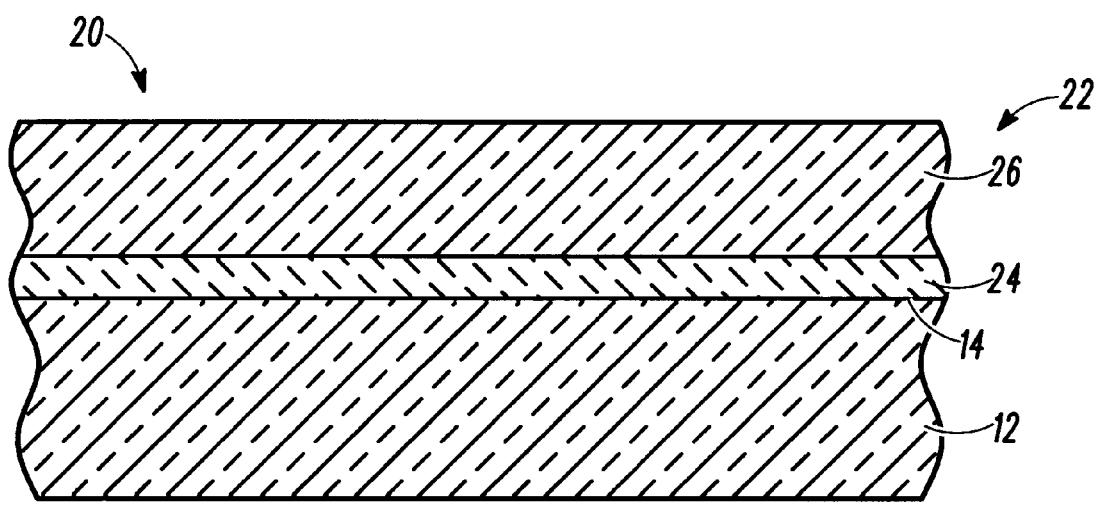
FIG. 2 is a partial cross-sectional view of the coated substrate in FIG. 1 following an oxygen anneal.

In a preferred embodiment, this invention is employed for forming a high dielectric layer 22 in FIG. 2 on a silicon substrate 12. Substrate 12 comprises a bare silicon surface 14 onto which layer 22 is formed.

Figure 1:
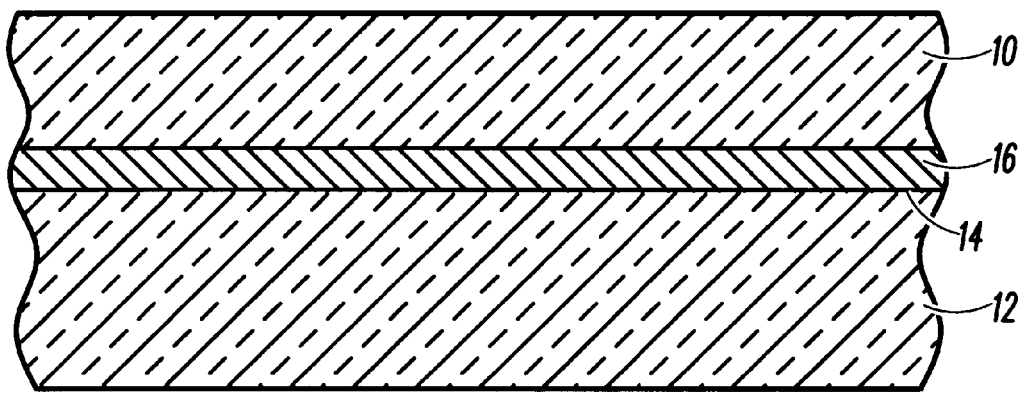
FIG. 1 is a partial cross-sectional view showing a coated silicon substrate comprising a metal titanate thin film and an oxidizable metal thin film in accordance with the method of this invention.

In accordance with this invention, referring to FIG. 1, surface 14 is initially coated with a thin film 16 composed of an oxidizable metal, which is metallic tantalum in this preferred embodiment. Film 16 is formed by sputtering tantalum in an argon atmosphere directly on to the silicon surface at a temperature between about 100° C. and 150° C. The relatively low sputtering temperature and inert gas environment cooperate to inhibit oxidation of the silicon surface 14 as well as the tantalum. In general, it is desired to deposit the tantalum so as to form a continuous film coating surface 14. Films having thickness less than about 25 A° tend to include discontinuities that expose the silicon. Films having thickness greater than about 500 A° increase the total thickness of the dielectric layer without significant improvement in electrical performance and require extended annealing time to complete oxidation. Preferably, thin film 16 is between about 50 A° and 150 A° thick.

A thin film 10 of zirconium titanate is sputtered directly on to metal film 16. Sputtering is carried out at a temperature between about 150° C. and 550° C. in a low pressure atmosphere composed of argon and oxygen. It is pointed out that the presence of oxygen in the sputtering gas tends to produce surface oxidation of the tantalum, so that the tantalum thin film deposited in accordance with this invention also serves to protect the underlying silicon at this stage of the process. The thickness of the deposited film is mainly determined by the dielectric properties to achieve desired electrical performance in the product device. In a typical example, film 10 is suitably deposited in a thickness up to about 3000 A° and preferably between about 100 A° and 1000 A°. In this preferred embodiment, the film thickness is about 750 A°.

Following deposition, the structure is annealed to recrystalize the sputtered zirconium titanate and develop the desired high dielectric constant. Annealing is suitably carried out at a temperature between about 450° C. and 875° C., preferably between 600° C. and 875° C., for between 2 and 10 minutes, although longer times up to several hours may be necessary at lower temperatures or for thicker films. By way of an example, preferred conditions for annealing a 750 A° thick film are 800° C. for about 5 minutes. Annealing is carried out in oxygen gas or an atmosphere containing oxygen to maximize the oxygen content of the titanate and increase the electrical leakage resistance, thereby reducing the tendency for electrical leakage in the product device. During this oxygen anneal, tantalum reacts with oxygen that diffuses from the atmosphere to form tantalum oxide, $Ta_2O_5$. Preferably, the annealing time is sufficient to substantially oxidize the film and minimize residual metallic tantalum in the film.

The resulting dielectric coated structure 20 is shown in FIG. 2 and comprises a dual-film dielectric layer 22 on silicon substrate 12. Dielectric layer 22 comprises a thin film 24 formed of tantalum oxide and immediately applied to silicon surface 14 and a thin film 26 formed of oxygen-annealed zirconium titanate overlying the tantalum oxide thin film. It is a significant feature of this invention that silicon surface is substantially free of oxidation. This is attributed to the presence of the metallic tantalum film that preferentially reacts with oxygen and thereby provides a barrier to protect the underlying silicon. Moreover, the method of this invention produces a metal titanate film that is fully annealed in the presence of oxygen and exhibits a high dielectric constant. Following annealing, the coated substrate is further processed to complete the desired electrical features for the device. This may include, for example, etching to remove unwanted material and limit the dielectric layer to selected regions of the substrate, or deposition of metal onto the dielectric layer to form an electrode that is capacitively coupled to the substrate through the dielectric layer.

Therefore, this invention provides a dielectric coated silicon substrate that comprises an oxygen annealed zirconium titanate film and an oxidized tantalum film and exhibits an increased dielectric constant and an increased effective capacitance, particularly in comparison to comparable titanate films formed directly onto the silicon surface. A structure was formed in accordance with the described embodiment and comprising a zirconium titanate thin film having a thickness of 750 A° that was deposited onto a tantalum thin film having a thickness of about 100 A° and oxygen annealed. A metal electrode was affixed to the titanate film. The effective capacitance was measured between the electrode and the substrate and found to be about 4.1 femtofarads per square micrometer, corresponding to an effective dielectric constant of about 35. For purposes of comparison, a comparable oxygen-annealed zirconium titanate film having a thickness of about 750 A° and deposited directly onto silicon, but without the intermediate tantalum film in accordance with this invention, exhibits an effective capacitance of about 2.6 femtofarads per square micrometer and an effective dielectric constant of about 22. Moreover, zirconium titanate films exhibited effective dielectric constants less than about 24 when formed directly on silicon surface even at thicknesses up to about 1200 A°. Thus, the method of this invention produces a dielectric layer having an improved effective capacitance and well suited for forming dynamic random access memory, capacitors and the like.

While not limited to any particular theory, it is believed that effective capacitance is dependent the the total dielectric material coating the silicon of the substrate. Thus, for oxygen-annealed titanate films formed directly onto the silicon surface, oxidation of the silicon at the interface forms silicon dioxide that reduces the effective capacitance of the dielectric layer. In accordance with this invention, a film is initially applied to the silicon surface that is formed of a metal that preferentially reacts with oxygen relative to the silicon and thus serves as an oxygen getter to protect the underlying silicon. In addition, it is desired that the oxide of the metal provide a dielectric constant greater than that of silicon dioxide. For tantalum in the described embodiment, tantalum oxide exhibits a dielectric constant of about 22 for bulk material, significantly greater than silicon dioxide having a dielectric constant of 3.9. In addition to tantalum, titanium and zirconium are preferentially oxidizable relative to silicon and may form suitable protective films.

Although a zirconium titanate film was utilized in the described embodiment, the method of this invention may be applied in forming titanate films containing metals other than zirconium. In general, useful titanates are characterized by the formula $MTiO_x$, wherein M comprises one or more metals and x varies depending upon the valance of the particular metal or metals. Preferably, the metal species is predominantly formed of one or more metals selected from the group consisting of strontium, barium, lead and zirconium, and may include minor additions of lanthanum or other secondary metals to enhance electrical or mechanical properties for a particular application. Preferred titanates include strontium titanate, $SrTiO_3$; barium titanate, $BaTiO_3$; lead titanate, $PbTiO_3$; lead zirconium titanate, $Pb(Zr,Ti)O_3$; barium neodymium titanate, $BaNd_2Ti_5O_{15}$; lead-modified lanthinum zirconium titanate, $(Pb,La)(Zr,Ti)O_3$. Also, while in the described embodiments the titanate thin films were deposited by sputtering, thin films may be deposited by any suitable process, including chemical vapor deposition, metal-organic chemical vapor deposition and sol-gel.

While this invention has been described in terms of certain embodiments thereof, it is not intended that it be limited to the above description, but rather only to the extent set forth in the claims that follow.

The embodiment of the invention in which an exclusive property or privilege is claimed are defined as follows:

1. A method for forming an oxygen-annealed zirconium titanate thin film onto a substrate having a silicon surface comprising depositing a metallic tantalum thin film onto the silicon surface, sputtering a zirconium titanate thin film onto the metallic tantalum thin film, and annealing the zirconium titanate thin film in an oxidizing atmosphere for a time and at a temperature effective to recrystalize the zirconium titanate thin film and to substantially oxidize the metallic tantalum thin film to form a tantalum oxide thin film, whereupon the zirconium titanate thin film and the tantalum oxide thin film form a high dielectric layer on the silicon surface.

2. A method in accordance with claim 1 wherein the metallic tantalum thin film substantially covers the silicon surface and has a thickness between about 25 A° and 500 A°.

3. A method in accordance with claim 1 wherein the zirconium titanate thin film has a thickness between about 100 A° and 1000 A°.

4. A method in accordance with claim 1 wherein annealing is carried out in an atmosphere containing oxygen and at a temperature between about 450° C. and 875° C.

5. A method for forming a dielectric layer onto a substrate having a silicon surface comprising sputtering metallic tantalum onto the silicon surface in a non-oxidizing atmosphere to form a metallic tantalum thin film substantially covering the silicon surface and having a thickness between about 50 A° and 150 A°, sputtering a zirconium titanate thin film having a thickness between about 100 A° and 1000 A° onto the metallic tantalum thin film, and heating the zirconium titanate film in an atmosphere containing oxygen at a temperature between about 600° C. and 875° C. for a time between about 2 and 10 minutes and effective to anneal the zirconium titanate thin film to increase the dielectric constant thereof and to concurrently oxidize the metallic tantalum thin film to form a tantalum oxide thin film intermediate the silicon surface and the zirconium titanate thin film, whereupon the zirconium titanate thin film and the tantalum oxide thin film form a dielectric layer on the silicon surface.

* * * * *